(12) United States Patent  
Kim

(10) Patent No.: US 7,390,751 B2  
(45) Date of Patent: Jun. 24, 2008

(54) DRY ETCHING METHOD AND APPARATUS FOR PERFORMING DRY ETCHING

(75) Inventor: Sang-Kwon Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 112 days.

(21) Appl. No.: 11/313,851

(22) Filed: Dec. 22, 2005

(65) Prior Publication Data

US 2006/0130972 A1 Jun. 22, 2006

(30) Foreign Application Priority Data

Dec. 22, 2004 (KR) .................. 10-2004-0110601

(51) Int. Cl.
*H01L 21/302* (2006.01)
(52) U.S. Cl. .............................. 438/714; 438/5; 438/14; 438/715; 216/71
(58) Field of Classification Search ............ 156/345.47, 156/345.51, 345.53; 438/714, 715, 5, 14; 118/724; 216/71
See application file for complete search history.

(56) References Cited

U.S. PATENT DOCUMENTS

| | | | | | |
|---|---|---|---|---|---|
| 4,275,289 | A | * | 6/1981 | Lord | 219/121.52 |
| 5,445,709 | A | * | 8/1995 | Kojima et al. | 438/729 |
| 5,990,016 | A | * | 11/1999 | Kim et al. | 438/707 |
| 2004/0173311 | A1 | * | 9/2004 | Ichimaru et al. | 156/345.27 |

FOREIGN PATENT DOCUMENTS

| | | | |
|---|---|---|---|
| JP | 04-275420 | * | 10/1992 |
| JP | 05-243191 | * | 9/1993 |
| JP | 11-040545 | * | 2/1999 |
| JP | 2002-076103 | * | 3/2002 |
| KR | 10-2004-0059262 | | 7/2004 |

* cited by examiner

*Primary Examiner*—George A. Goudreau
(74) *Attorney, Agent, or Firm*—Lowe Hauptman Ham & Berner LLP

(57) ABSTRACT

A dry etching method includes loading a wafer on a lower electrode having at least two cooling paths. Cooling fluids having different temperatures are supplied to each of the cooling paths of the lower electrode so that the multiple cooling paths are at different temperatures from one another. The wafer is etched during cooling.

9 Claims, 6 Drawing Sheets

DRY ETCHING METHOD AND APPARATUS FOR PERFORMING DRY ETCHING

BACKGROUND OF THE INVENTION (a) Field of the Invention

The present invention relates to a dry etching method and an apparatus for performing dry etching, and more particularly to the dry etching method and apparatus including multiple cooling paths.

(b) Discussion of the Related Art

Equipment for manufacturing semiconductor devices is generally classified as either equipment for preceding processes or equipment for subsequent processes. The equipment for preceding processes is used to form a photoresist pattern on a semiconductor substrate, such as coating a photoresist layer, exposing, and developing. In contrast, the equipment for subsequent processes is used for various processes related to a patterned substrate, such as an ion implantation process wherein impurity ions are implanted into the patterned substrate, an etching process wherein a target layer is selectively removed by using the photoresist pattern, a deposit process wherein a thin film is deposited on the semiconductor substrate, and a metallization process wherein a circuit pattern is interconnected.

Etching is generally performed by either a wet etching apparatus or a dry etching apparatus. The known dry etching apparatus includes a lower electrode disposed opposite an upper electrode in an etching chamber. In the known dry etching apparatus, a wafer is loaded on the lower electrode, and process gases are supplied and converted into plasma by the upper electrode.

FIG. 1 shows an example of a lower electrode in the known dry etching apparatus. As shown in the figure, the lower electrode 102 defines cooling paths 104 in which cooling gas flows. A clamping part 106 presses a wafer W loaded on the lower electrode 102, such that the wafer W is held on the lower electrode 102, and is cooled by the cooling gas flowing in the cooing paths 104 during etching of the wafer W.

When the known dry etching apparatus is used to etch the wafer W, the uniformity in the thickness of the remaining layer after the etching process depends on process conditions, such as a source power of the dry etching apparatus, chamber pressure, ratio of process gases, and uniformity of an etch target layer. The uniformity in thickness of the remaining layer is also largely dependent on a rear surface temperature of the wafer.

FIG. 2 is a graph showing etch rate and uniformity in thickness of the remaining layer on the wafer as a function of the rear surface temperature of the wafer. As shown in FIG. 2, both the etch rate and the uniformity in the thickness of the remaining layer are increased as the rear surface temperature of the wafer is increased.

FIG. 3 is a graph showing simulated data of the thickness of the remaining layer as a function of position after etching with the known dry etching apparatus. As shown in FIG. 3, the remaining layer is not uniformly thick.

As described above, in the known dry etching apparatus the temperature of the lower electrode is uniform over the entire rear surface of the wafer. However, uniformity, or lack thereof, of the deposited etch target layer is not accounted for during the setting of process conditions. The uniformity of the deposited etch target layer affects the uniformity in the thickness of the remaining layer. Therefore, it is difficult to improve the uniformity in the thickness of the remaining layer.

SUMMARY OF THE INVENTION

To address the above-described and other problems, it is an object of the present invention is to provide a dry etching method that includes loading a wafer on a lower electrode having at least two cooling paths. Cooling fluids having different temperatures are supplied to each of the cooling paths of the lower electrode so that the multiple cooling paths are at different temperatures from one another. The wafer is etched during cooling.

The present invention further provides an apparatus for performing dry etching. A lower electrode defining at least two cooling paths is disposed in an etching chamber. An upper electrode, which is configured to convert process gases into plasma, is disposed above the lower electrode. A fluid supply device is configured to supply cooling fluids having different predetermined temperatures to the cooling paths.

The present invention further provides a method of etching a semiconductor that includes cooling a first portion of the semiconductor to a first temperature, cooling a second portion of the semiconductor to a second temperature, and etching a layer of the semiconductor during cooling of the first and second portions.

The present invention still further provides an etching apparatus including an upper electrode disposed in an upper portion of an etching chamber, and a lower electrode disposed in a lower portion of the etching chamber opposite the upper electrode. The lower electrode defines first and second cooling path. A first fluid supply device is configured to supply a first coolant at a first temperature to the first cooling path. A second fluid supply device is configured to supply a second coolant at a second temperature to the second cooling path.

BRIEF DESCRIPTION OF THE DRAWINGS

The accompanying drawings, which are incorporated in and constitute a part of the specification, illustrate an embodiment of the invention, and together with the description serve to explain principles of the invention.

DETAILED DESCRIPTION OF THE INVENTION

An exemplary embodiment of the present invention is described below with reference to the accompanying drawings.

Figure 4:
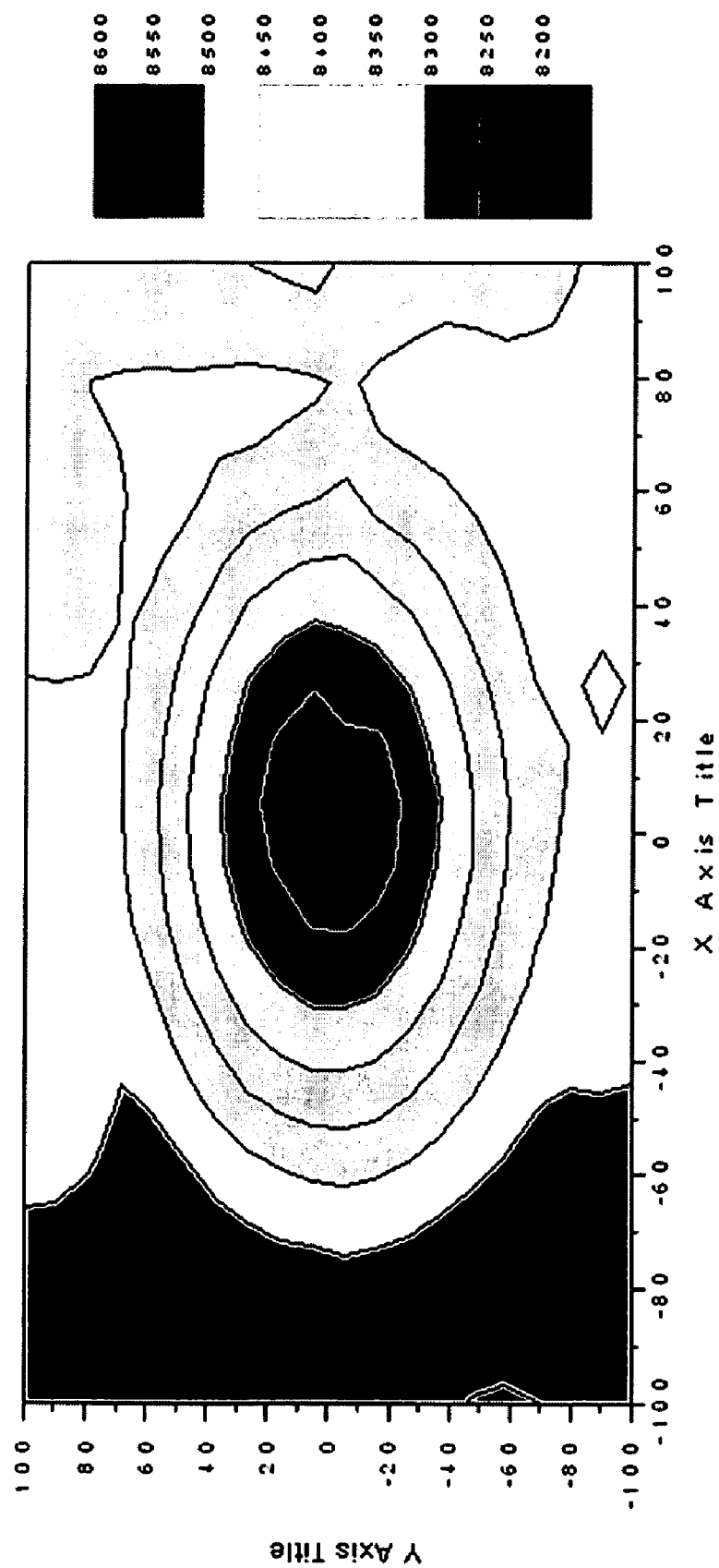
FIG. 4 is a graph showing measured data of a thickness distribution of an etch target layer after the layer is formed to have a predetermined thickness.

FIG. 4 is a graph showing measured data of an oxide layer thickness distribution in a wafer after the oxide layer is formed to have a predetermined thickness of about 8000 Å. According to the data, the thickness of the oxide layer is 8200 Å at a central portion of the wafer and 8600 Å at a peripheral portion of the wafer. Thus, as indicated in FIG. 4, the oxide layer, as an etch target layer, is thicker at the peripheral portion than at the central portion. Therefore, the thickness of the etch target layer can be non-uniform even before an etching process is performed.

Figure 5:
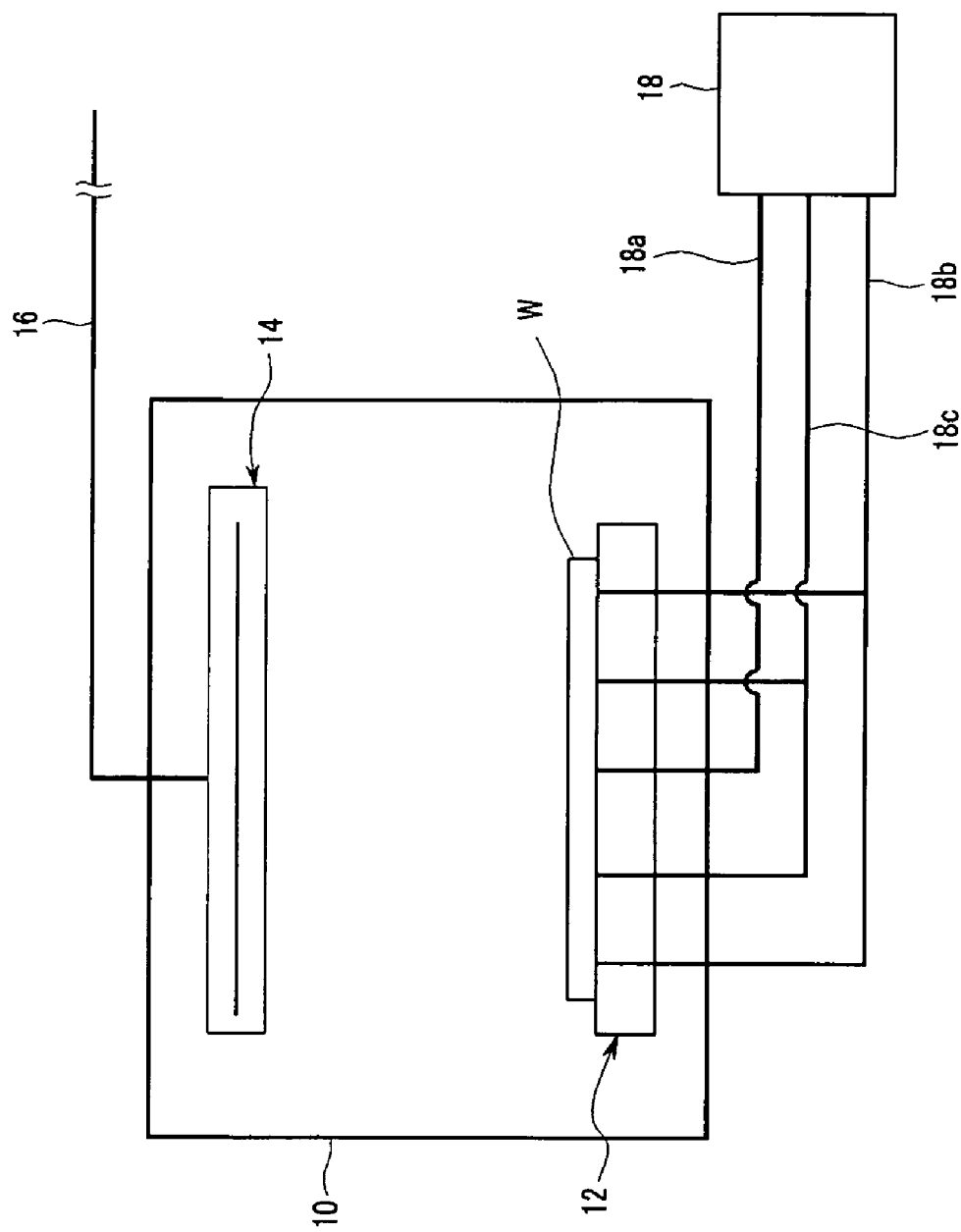
FIG. 5 is a schematic diagram of a dry etching apparatus according to the present invention.

To prevent a deterioration of thickness uniformity of a remaining layer after etching due to the non-uniformity in thickness of the etch target layer (i.e., due to a non-uniformity in the thickness of the layer to be etched before etching), the present invention uses the dry etching apparatus as shown in FIG. 5.

As shown in FIG. 5, the dry etching apparatus includes a lower electrode 12 located in an etching chamber 10. An upper electrode 14 for converting process gases into plasma is located in an upper part of the chamber 10, opposite the lower electrode 12. One or more process gases are supplied to the upper electrode 14 by an inflow pipe 16.

The lower electrode 12 has at least two cooling paths, and preferably three cooling paths including a central path, an edge path, and a middle path located between the central and edge paths. The multiple cooling paths of the lower electrode 12 are connected to multiple inflow pipes 18a, 18b and 18c, respectively.

The inflow pipes 18a, 18b and 18c are connected to a fluid supply device 18 for supplying cooling fluids having different predetermined temperatures to each of the inflow pipes 18a, 18b, and 18c.

For example, a cooling fluid having a temperature of 10° C. can be supplied to the central portion of the lower electrode 12 by the inflow pipe 18a, a cooling fluid having a temperature of 20° C. can be supplied to the middle portion of the lower electrode 12 by the inflow pipe 18c, and a cooling fluid having a temperature of 30° C. can be supplied to the edge portion of the lower electrode 12 by the inflow pipe 18b.

Figure 1:
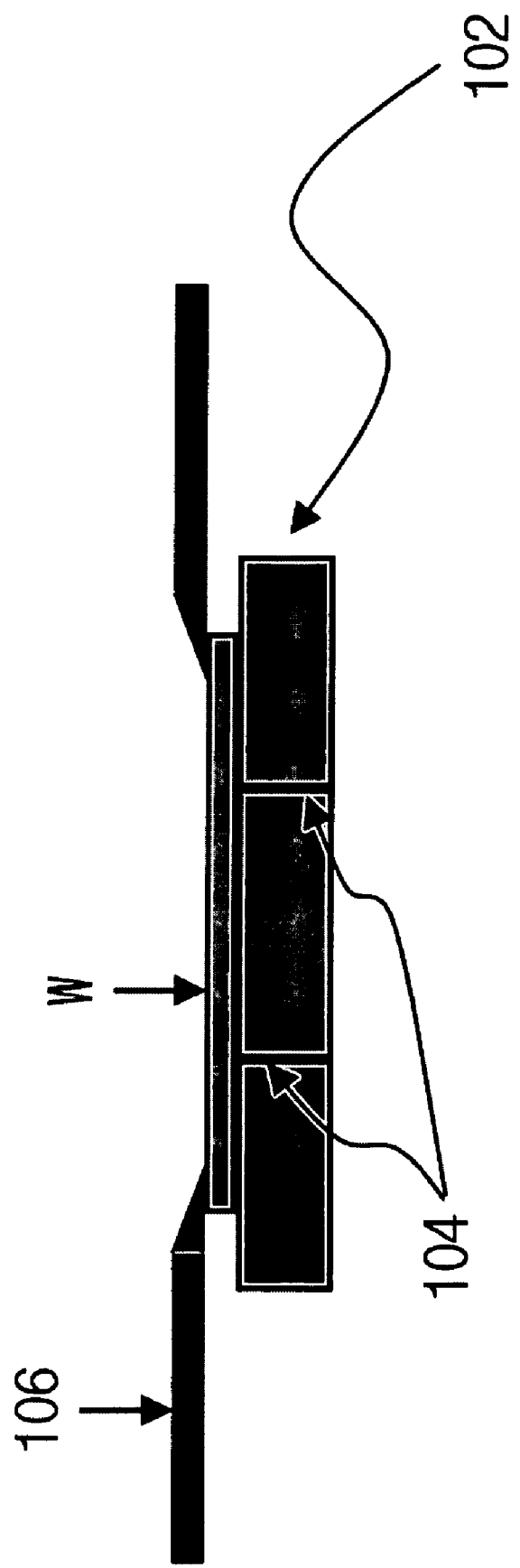
FIG. 1 is a schematic diagram showing a lower electrode of a known dry etching apparatus.
Figure 2:
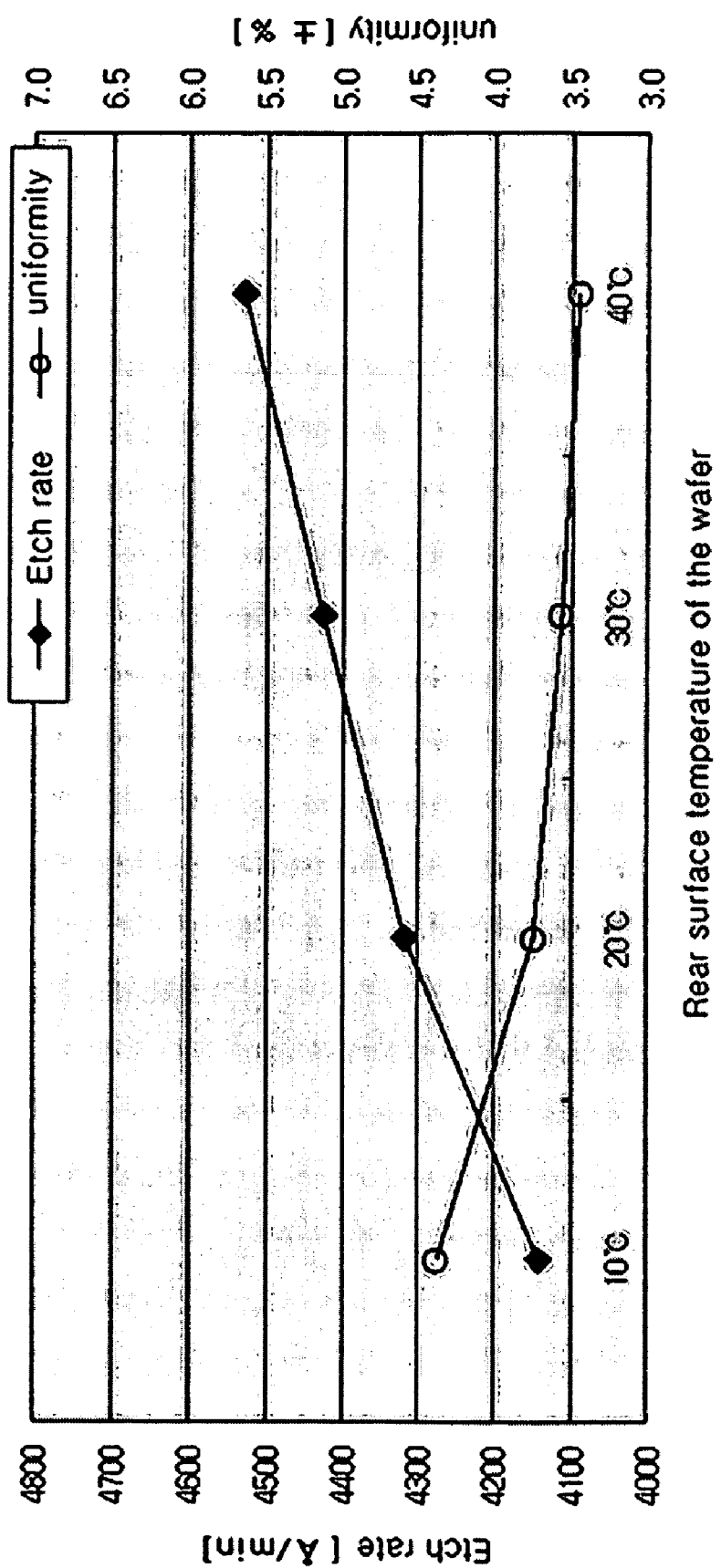
FIG. 2 is a graph showing etch rate and uniformity in thickness of a remaining layer on a wafer as a function of the rear surface temperature of the wafer.
Figure 3:
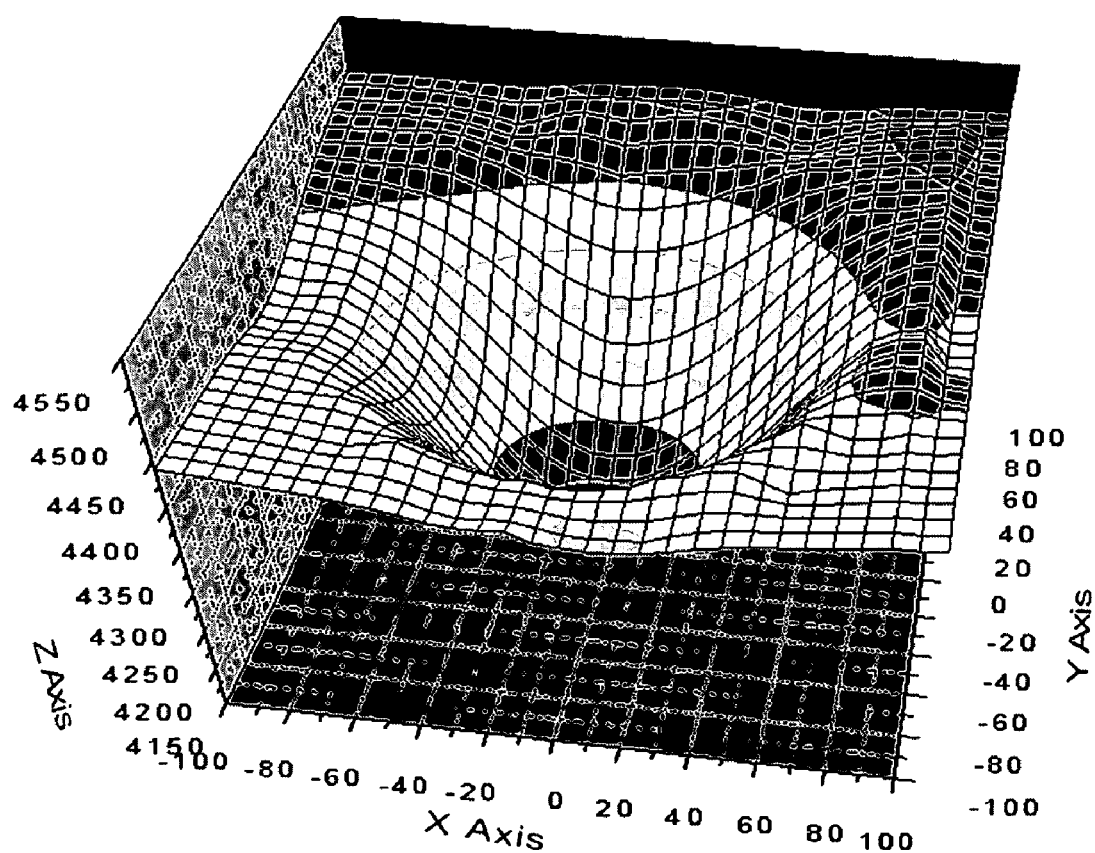
FIG. 3 is a graph showing simulated data of the thickness of the remaining layer as a function of position on the wafer after the etching process by the known dry etching apparatus.

The dry etching apparatus according to the present invention uses cooling fluids having different temperatures because the etch rate increases as the rear surface temperature of the wafer increases, as shown in FIG. 2.

Therefore, by using the dry etching apparatus according to the present invention, the peripheral portion of the wafer, where the etch target layer is thicker, is etched to a greater degree than the central portion of the wafer. By this arrangement, uniformity in the thickness of the remaining layer is improved.

Figure 6:
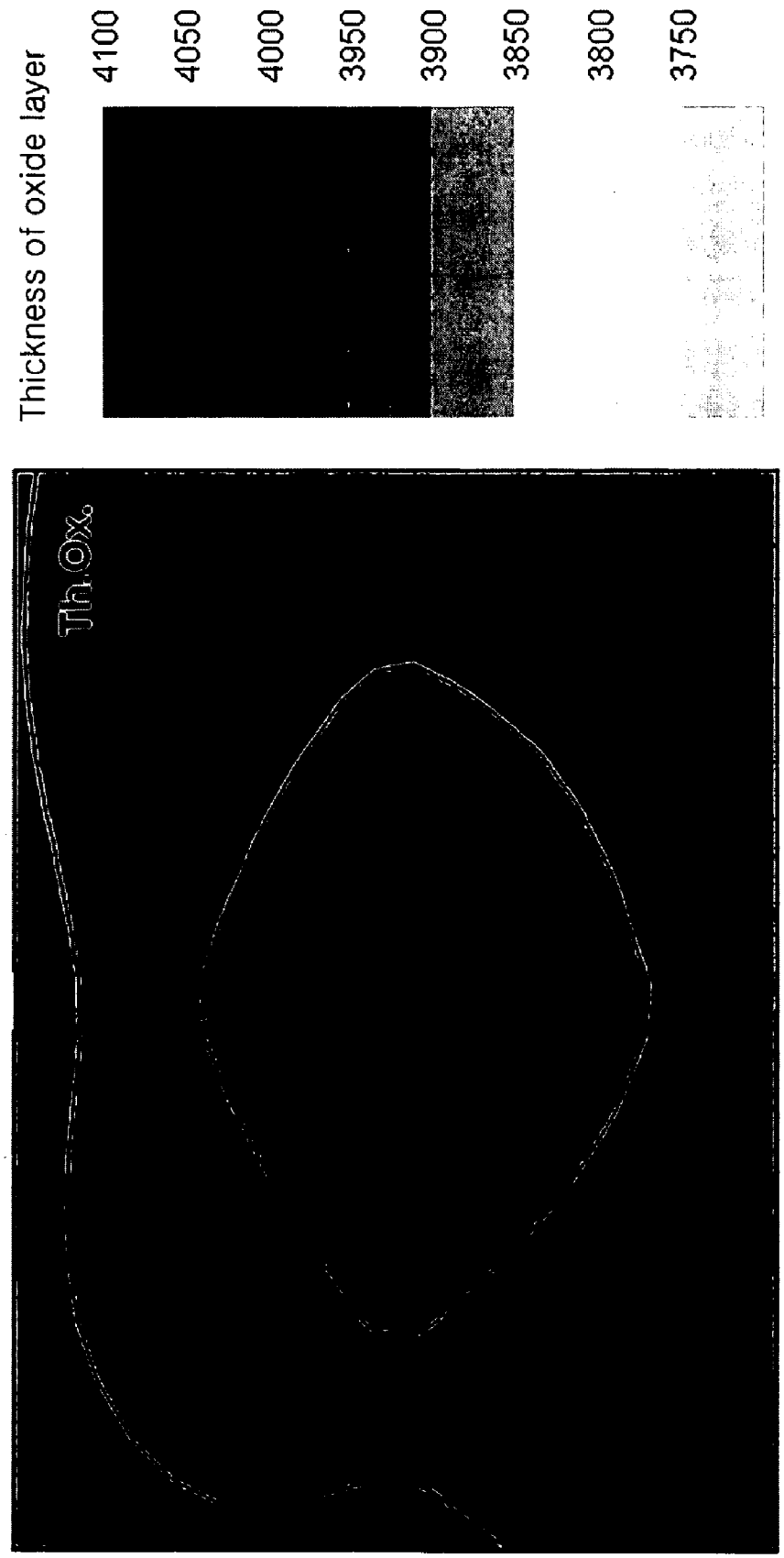
FIG. 6 is a graph showing measured data of a thickness distribution of the etch target layer after the layer is etched by the apparatus of FIG. 5.

FIG. 6 is a graph showing measured data of a thickness distribution of the etch target layer after the layer is etched by the dry etching apparatus of the present invention. In the etching process, a process gas of $C_4F_8$ is flowed at 16 sccm, Ar is flowed at 380 sccm, $O_2$ is flowed at 5 sccm, and CO is flowed at 300 sccm. The pressure of the process chamber is maintained at a level of 55 mTorr, and source power is maintained at 1700 MW.

As indicated by a comparison of FIG. 3 to FIG. 6, dry etching in accordance with the present invention provides an improvement in the uniformity in thickness of the remaining layer as compared to the known dry etching method.

As described above, selective etching performed in consideration of the variation in the thickness of the etch target layer can be performed by cooling different portions of the wafer to different temperatures. By this arrangement, the uniformity in the thickness of the remaining layer after etching can be improved.

The above discussion is directed to a preferred embodiment of the invention. It is to be understood, however, that the invention is not limited to the disclosed embodiment. Rather, the invention is intended to cover various modifications and equivalent arrangements included within the spirit and scope of the appended claims.

The present application claims priority to, and incorporates by reference herein in its entirety, Korean patent application no. 10-2004-0110601, filed on Dec. 22, 2004.

What is claimed is:

1. A dry etching method comprising:
   loading a wafer having an etch-target layer on a lower electrode, said lower electrode having a plurality of cooling paths comprising a central cooling path and an edge cooling a path;
   supplying cooling fluids having different temperatures to each of the cooling paths of the lower electrode so that the multiple cooling paths are at different temperatures from one another; and
   etching the wafer,
   wherein the etch-target layer is thicker at an edge portion thereof than at a central portion and a temperature of the cooling fluid supplied to the central cooling path is lower than that of the cooling fluid supplied to the edge cooling path.

2. The dry etching method according to claim 1, wherein the cooling paths further comprise a middle path located between the central and edge paths.

3. The dry etching method according to claim 2, wherein a temperature of the cooling fluid supplied to the edge path is higher than a temperature of the cooling fluid supplied to the middle path, and a temperature of the cooling fluid supplied to the middle path is higher than a temperature of the cooling fluid supplied to the central path.

4. The dry etching method according to claim 3, wherein the temperature of the cooling fluid supplied to the edge path is 30° C., the temperature of the cooling fluid supplied to the middle path is 20° C., and the temperature of the cooling fluid supplied to the central path is 10° C.

5. A method of etching a semiconductor having an etch-target layer, said method comprising the steps of:
   cooling a first portion of the semiconductor to a first temperature;
   cooling a second portion of the semiconductor to a second temperature; and
   etching an etch-target layer of the semiconductor during cooling of the first and second portions,
   wherein the step of cooling the first portion comprises passing a first cooling liquid through a first cooling path in a lower electrode on which the semiconductor is disposed;
   the step of cooling the second portion comprises passing a second cooling liquid through a second cooling path in the lower electrode; and
   the etch-target layer is thicker at the first portion thereof than at the second portion and a temperature of the cooling fluid supplied to the second cooling path is lower than that of the cooling fluid supplied to the first cooling path, wherein
   the first portion is at an edge of the semiconductor and the second portion is at a centre of the semiconductor.

6. The method according to claim 5, wherein the first temperature is greater than the second temperature.

7. The method according to claim 5, further comprising:
   cooling a third portion of the semiconductor to a third temperature.

8. The method according to claim 7, wherein the third portion is disposed between the first portion and the second portion.

9. The method according to claim 7, wherein the third temperature is lower than the first temperature and greater than the second temperature.

* * * * *